United States Patent [19]

Kashiyama

[11] Patent Number: 4,945,516
[45] Date of Patent: Jul. 31, 1990

[54] WRITE CONTROL CIRCUIT FOR A HIGH-SPEED MEMORY DEVICE

[75] Inventor: Masamori Kashiyama, Hadano, Japan

[73] Assignee: Hitachi, Ltd., Tokyo, Japan

[21] Appl. No.: 254,225

[22] Filed: Oct. 6, 1988

[30] Foreign Application Priority Data

Oct. 9, 1987 [JP] Japan .................................. 62-253769

[51] Int. Cl.$^5$ .............................................. G11C 7/00
[52] U.S. Cl. .................................. 365/189.05; 365/233
[58] Field of Search .................. 365/189.05, 233, 214, 365/194; 307/267, 265

[56] References Cited

U.S. PATENT DOCUMENTS

| | | | |
|---|---|---|---|
| 4,707,809 | 11/1987 | Ando | 365/195 X |
| 4,794,567 | 12/1988 | Akatsuka | 365/233 X |
| 4,802,129 | 1/1989 | Hoekstra et al. | 365/233 X |
| 4,802,131 | 1/1989 | Toyoda | 365/233 X |

OTHER PUBLICATIONS

Electronic Design, Dec. 27, 1984, pp. 157–170, Pipelined Static RAM Endows Cache Memories with 1-ns Speed.

Primary Examiner—Stuart N. Hecker
Assistant Examiner—Andrew L. Sniezek
Attorney, Agent, or Firm—Antonelli, Terry, Stout & Kraus

[57] ABSTRACT

A built-in write control circuit of an IC memory receives first and second write enable signals that each have a duration equal to two operation cycles, the phase difference between these signals being equal to any odd number of operation cycles. The first and second write enable signals are converted into first and second write mode signals, respectively, each having a duration equal to one operation cycle, with the second write mode signal having a phase difference relative to the first write mode signal equal to the phase difference between the first and second write enable signals. A write pulse generator is included which receives a train of clock pulses having an interval equal to one operation cycle, and generates a train of write pulses in synchronism with the clock pulses. These write pulses are gated by each of the first and second write mode signals, and the resulting gated write signal is applied to sense amplifiers to control writing data into a memory array.

7 Claims, 3 Drawing Sheets

WRITE CONTROL CIRCUIT FOR A HIGH-SPEED MEMORY DEVICE

BACKGROUND OF THE INVENTION

This invention relates to a write control circuit for a memory device, and more specifically to a write control circuit adapted for use in a very high-speed semiconductor memory device.

The write operation of a semiconductor memory device is controlled according to a write enable (WE) signal supplied externally. In a conventional high-speed semiconductor memory device, as shown in FIG. 3, the WE signal itself, after amplification by an amplifier-gate 6, is directly applied to sense amplifiers 14.

An improved write control circuit adapted for use in a high-speed semiconductor memory device is disclosed in Electronic Design, Dec. 27, 1984, pp. 157-170. In this circuit, as shown in FIG. 4, the WE signal is latched in a latch 15 by an externally supplied clock signal (CLK). The output of this latch activates a write timing generator 16 whose output signal is applied to the sense amplifiers 14. This timing mechanism not only eliminates many difficulties in the timing of various signals within a high-speed semiconductor memory device but also permits overlapping of input operations and output operations, taking advantages of the capability of forming a read cycle and a write cycle equal in length and timing.

For the conventional circuit shown in FIG. 3, the duration of the WE signal must be shorter than a write cycle. Even for the improved circuit shown in FIG. 4, the duration of the WE signal can not exceed the write cycle. On the other hand, for a very high-speed bipolar or GaAs memory device like those used as a cache memory or a register group in a supercomputer, a very short cycle time, for example a few nanoseconds or so, is required. In a semiconductor memory device which is required to operate at such a very high speed, when mounting conditions are taken into account, it is not easy to control the write operation correctly by means of the WE signal with a duration equal to or shorter than the write cycle, owing to an substantial decrease in pulse duration resulting from waveform deterioration, noises, skews, and the like. Where the pulse duration is exceedingly short, it becomes very difficult to precisely control the timing of the rising or falling edge or the pulse duration.

SUMMARY OF THE INVENTION

An object of the present invention is to permit the utilization of WE signals wide enough to obviate the above-mentioned problem of timing for the reliable write operation of a very high-speed memory device.

The write control circuit of this invention receives first and second write enable signals each having a duration equal to two write cycles, with the phase difference between these signals being equal to at least one write cycle. The first and second write enable signals are converted into first and second write mode signals, respectively, each having a duration equal to one write cycle, with the second write mode signal having a phase difference relative to the first write mode signal equal to the phase difference between the first and second write enable signals. A circuit is included which generates a write execute signal in each signal period of the first and second write mode signals.

Thus, the present invention uses write enable signals twice or more as wide as those used in prior art memory devices, and yet two or more successive write cycles can take place without error. Consequently, the controlling of timing and duration of the write enable signal becomes easy, and the influences of attenuation, noises, skews, and the like diminish, resulting in a remarkable decrease in write errors for high-speed memory devices.

DETAILED DESCRIPTION OF THE PREFERRED EMBODIMENT

Figure 1:
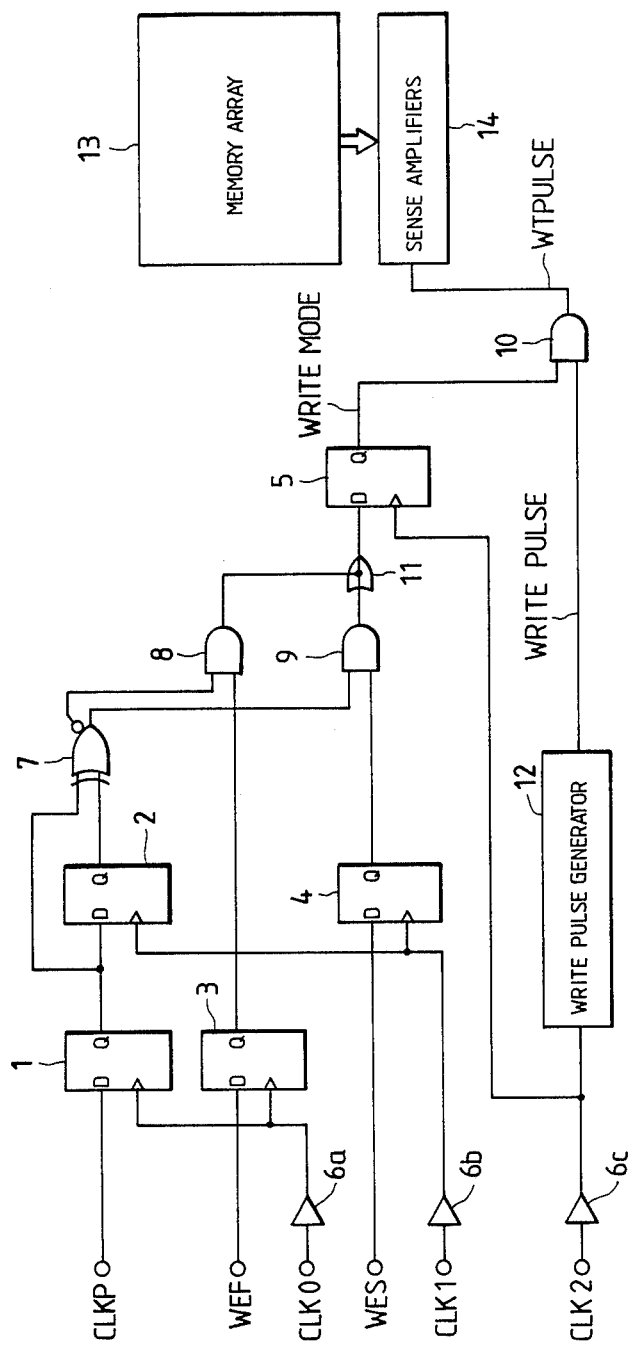
FIG. 1 shows a write control circuit as an embodiment of the present invention.
Figure 2:
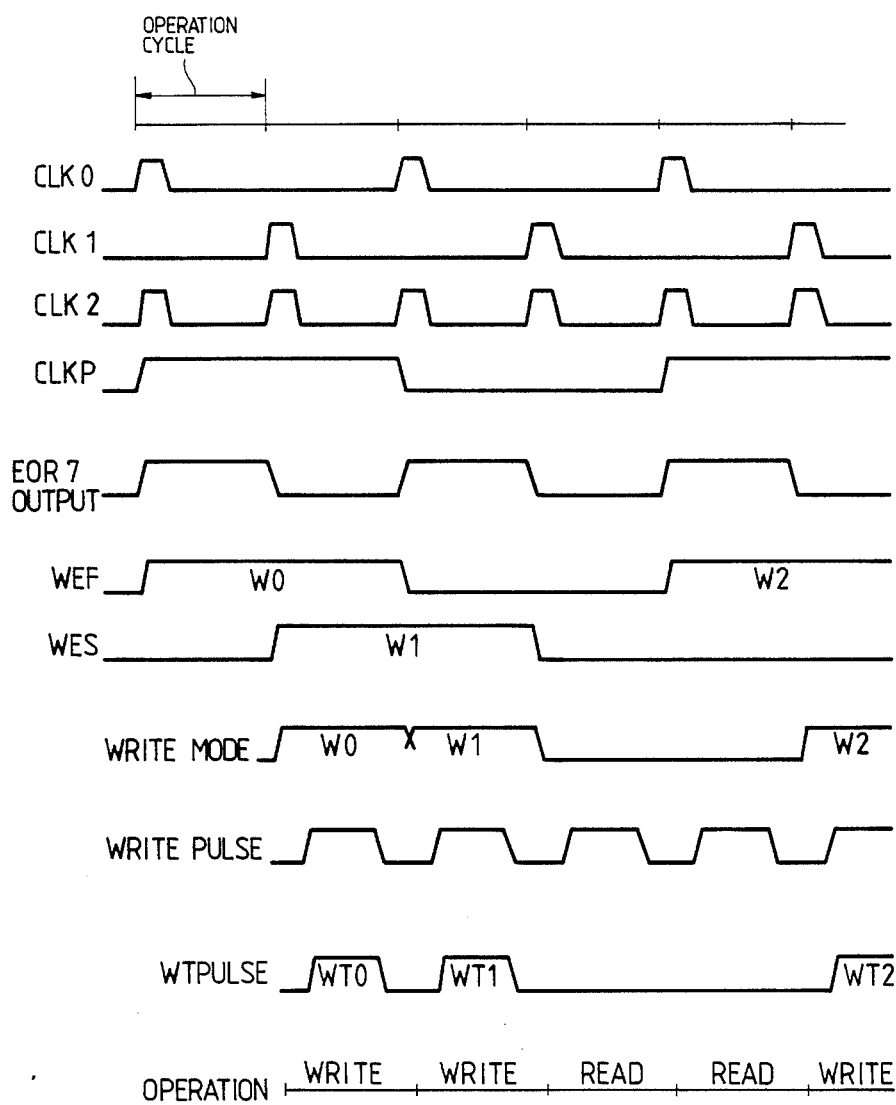
FIG. 2 shows the waveforms of signals appearing at various points of the circuit of FIG. 1.
Figure 3:
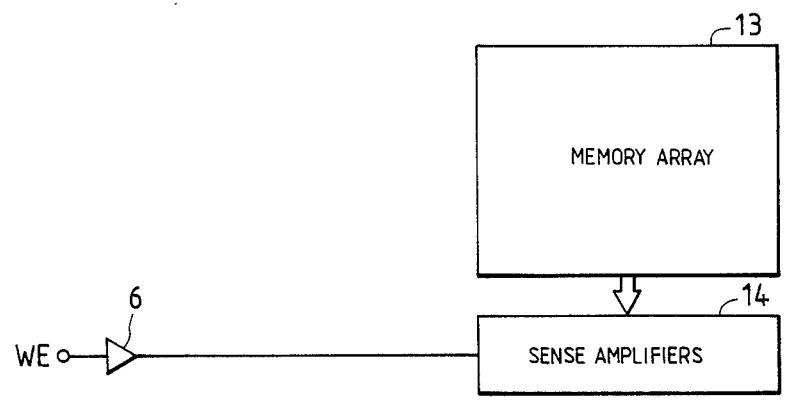
FIG. 3 and FIG. 4 show, by way of comparison, prior art write control circuits.
Figure 4:
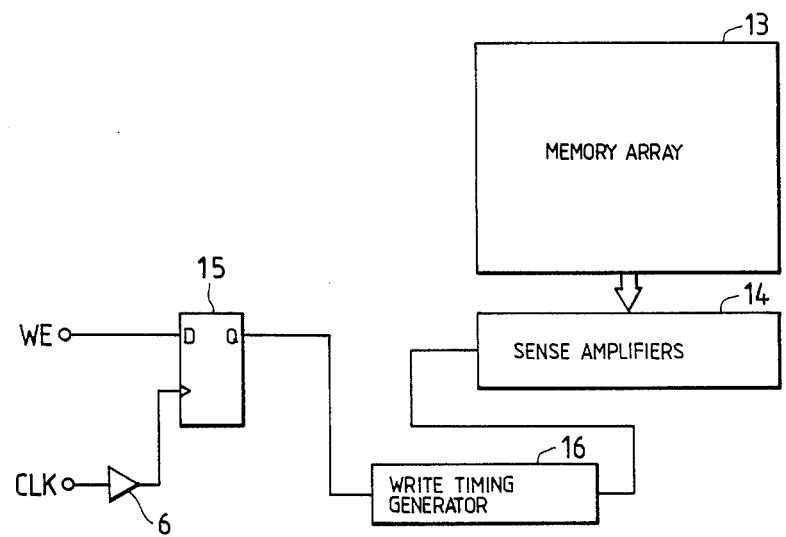

FIG. 1 shows the logic structure of an example of the write control circuit according to the present invention, and FIG. 2 shows the waveforms of signals appearing at various points of the circuit shown in FIG. 1. The circuit shown in FIG. 1 is arranged within an integrated circuit memory device. CLKP, CLK0, CLK1 and CLK2 are externally supplied clock signals. As is shown in FIG. 2, the clock pulses of CLK0 and CLK1 each have an interval of two operation cycles, and there is a phase difference of one operation cycle between these two clock signals. The clock pulses of CLK2 have an interval of one operation cycle. CLKP has a duration and an interval both equal to two operation cycles, and is synchronized with CLK0. A write cycle and a read cycle for this embodiment have the same length. Two series of write enable signals, WEF and WES, are externally supplied. Each of WEF and WES has a duration equal to two operation cycles, and there is a phase difference of at least one operation cycle between them. WEF is supplied in synchronism with CLK0, and WES is supplied in synchornism with CLK1. It is obvious that the phase difference between supplied WEF and WES signals corresponds to the interval between the write requests that call the supplied WEF and WES signals, respectively, for the execution thereof. When two consecutive write operations are requested, the phase difference is equal to one operation cycle, as shown in FIG. 2. In the present embodiment, the phase difference between WEF and WES signals can be any odd number of operation cycles since there is a phase difference of one operation cycle between CLK0 and CLK1, with which the WEF and WES signals are respectively synchronized.

A latch 2 functions as a delay element which generates a signal corresponding to CLKP delayed for a time equal to one operation cycle. An exclusive-OR gate 7, AND gates 8 and 9, a wired-OR 11 and a latch 5 constitute a circuit for converting each of WEF and WES into a write mode signal having an duration equal to one operation cycle.

CLK0, passing through an amplifier gate 6a, sets WEF in a latch 3, while CLK1, passing through an amplifier gate 6b, sets WES in a latch 4. CLK0 also sets CLKP in a latch 1 whose "1" output is set in the latch 2 by CLK1 and at the same time applied to one of the two inputs of the exclusive-OR gate 7. The other input of the exclusive-OR gate 7 receives the output of the latch 2. As a result, the output of the exclusive-OR gate 7 rises to a high level during the first operation cycle in a period during which CLKP is high and also during the first operation cycle in a period during which CLKP is low. The output of the exclusive-OR gate 7 functions as a pitch signal for extracting from each of WEF and WES a write mode signal having a duration equal to one operation cycle. More particularly, the WES output of the latch 4 and the WEF output of the latch 3 are gated at the AND gates 9 and 8 by the output of the exclusive-OR gate 7 and the inverted output thereof, respectively. The outputs of these AND gates are set, through the wired-OR 11, in the latch 5 by CLK2 supplied through an amplifier gate 6c. Accordingly, the write mode signal, that is, the output of the latch 5, is a signal with a duration equal to one operation cycle corresponding to a latter half of either WEF or WES.

CLK2, passing through the amplifier gate 6c, is also supplied to a write pulse generator 12 which generates a train of write pulses in synchronism with CLK2. These write pulses are properly adjusted with respect to set-up time, duration, hold time and the like as required for controlling the write operation of a memory array 13. This train of write pulses is gated at an AND gate 10 by the write mode signal from the latch 5. The gated write pulse, WTPULSE, is sent to sense amplifiers 14. Upon reception of WTPULSE, the sense amplifiers 14 operate as write circuits and execute the writing of data into the memory array 13.

What is claimed is:

1. A write control circuit of a memory device comprising:
   a first receiving circuit for receiving a first write enable signal with a pulse duration equal to two write cycles;
   a second receiving circuit for receiving a second write enable signal with a pulse duration equal to two write cycles and having a phase difference equal to at least one write cycle relative to said first write enable signal;
   a converting circuit connected to said first and second receiving circuits for converting said first write enable signal into a first write signal with a pulse duration equal to one write cycle and said second write enable signal into a second write signal with a pulse duration equal to one write cycle and having a phase difference relative to said first write signal equal to the phase difference between said first and second write enable signals; and
   a generating circuit connected to said converting circuit and responsive to each of said first and second write signals for generating in each signal period of said first and second write signals a write execute signal for controlling execution of a write operation.

2. A write control circuit as claimed in claim 1, wherein said generating circuit comprises a third receiving circuit for receiving a first clock signal having a clock pulse interval equal to one write cycle, a pulse generating circuit responsive to said first clock signal for generating a train of pulses each having a duration equal to a pulse duration of said write execute signal and being synchronized with said first clock signal, and a first gate circuit connected to said converting circuit and said pulse generating circuit for transmitting one of said pulses generated by said pulse generating circuit in response to each of said first and second write signals.

3. A write control circuit as claimed in claim 1, wherein said generating circuit comprises a third receiving circuit for receiving a clock signal with a pulse duration and a pulse interval both equal to two write cycles, a delaying circuit for delaying said clock signal for a time equal to one write cycle, a logic circuit connected to said third receiving circuit and said delaying circuit for generating a gating signal having a gating signal pulse which lasts only when said clock signal and said delayed clock signal are in different logic states, and a gate circuit connected to said first and second receiving circuits and said logic circuit for transmitting part of said first write enable signal while an inverted gating signal pulse of said gating signal exists and for transmitting part of said second write enable signal while said gating signal pulse exists.

4. A write control circuit as claimed in claim 1, wherein said write cycle has the same length as a read cycle.

5. A write control circuit as claimed in claim 1, wherein the phase difference of said second write enable signal relative to said first write enable signal is equal to an odd number of write cycles.

6. An integrated circuit memory device which comprises a memory array, a read/write circuit connected to said memory array, and a write control circuit connected to said read/write circuit, said write control circuit comprising:
   a first receiving circuit for receiving a first write enable signal with a pulse duration equal to two write cycles;
   a second receiving circuit for receiving a second write enable signal with a pulse duration equal to two write cycles and having a phase difference equal to at least one write cycle relative to said first write enable signal;
   a third receiving circuit for receiving a clock signal having a clock pulse interval equal to one write cycle;
   a converting circuit connected to said first and second receiving circuits for converting said first write enable signal into a first write signal with a pulse duration equal to one write cycle and said second write enable signal into a second write signal with a pulse duration equal to one write cycle and having a phase difference relative to said first write signal equal to the phase difference between said first and second write enable signals;
   a pulse generating circuit connected to said third receiving circuit for generating a train of write control pulses in synchronism with said clock signal; and
   a gate circuit connected to said converting circuit, said pulse generating circuit and said read/write circuit for transmitting, in response to each of said first and second write signals, one of said write control pulses to said read/write circuit.

7. A memory device as claimed in claim 6, wherein the phase difference of said second write enable signal relative to said first write enable signal is equal to an odd number of write cycles.

* * * * *